United States Patent
Yang

[11] Patent Number: 6,153,904
[45] Date of Patent: Nov. 28, 2000

[54] FABRICATION METHOD FOR INCREASING THE COUPLING EFFICIENCY OF ETOX FLASH MEMORY DEVICES

[75] Inventor: Yu-Hao Yang, Hsinchu, Taiwan

[73] Assignee: Winbond Electronics Corporation, Hsinchu, Taiwan

[21] Appl. No.: 09/205,691

[22] Filed: Dec. 4, 1998

[51] Int. Cl.[7] .................. H01L 21/8247; H01L 29/788
[52] U.S. Cl. ..................... 257/316; 438/264; 438/564
[58] Field of Search ..................... 438/257–267, 438/593–594, 564

[56] References Cited

U.S. PATENT DOCUMENTS

| | | |
|---|---|---|
| 5,270,234 | 12/1993 | Huang et al. . |
| 5,374,575 | 12/1994 | Kim et al. . |
| 5,429,970 | 7/1995 | Hong . |
| 5,498,560 | 3/1996 | Sharma et al. . |
| 5,538,913 | 7/1996 | Hong . |
| 5,712,179 | 1/1998 | Yuan . |
| 5,773,343 | 6/1998 | Lee et al. ............................... 438/259 |
| 5,879,989 | 3/1999 | Lim ....................................... 438/257 |
| 5,953,602 | 9/1999 | Oh et al. ................................ 438/201 |
| 5,960,285 | 9/1999 | Hong ..................................... 438/264 |
| 5,972,752 | 10/1999 | Hong ..................................... 438/264 |
| 6,093,945 | 7/2000 | Yang ..................................... 257/317 |

*Primary Examiner*—Richard Booth
*Attorney, Agent, or Firm*—Finnegan, Henderson, Farabow, Garrett & Dunner, L.L.P.

[57] ABSTRACT

A method of manufacturing an electron tunnel oxide (ETOX) flash memory device having an improved coupling efficiency includes sequentially forming a tunnel oxide, a floating gate, a dielectric layer, and a control gate on a substrate, where the tunnel oxide and the bottom of the floating gate are formed to be narrower than the top of the floating gate, the dielectric and the control gate.

30 Claims, 4 Drawing Sheets ical ETOX flash

FABRICATION METHOD FOR INCREASING THE COUPLING EFFICIENCY OF ETOX FLASH MEMORY DEVICES

BACKGROUND OF THE INVENTION

1. Field of the Invention

The present invention relates to a method for fabricating an electron tunnel oxide (ETOX) flash memory device with improved coupling efficiency.

2. Description of the Related Art

Coupling efficiency is an important factor that affects the performance of a flash memory. Coupling efficiency can be defined as the amount of floating gate voltage coupled from the control gate voltage. In terms of capacitance, coupling efficiency can also be defined as the ratio of capacitance between the floating gate and the control gate to the total capacitance of the memory cell.

During operation of a flash memory device, the coupling efficiency strongly effects the voltage gained in the floating gate from the control gate. The larger the coupling efficiency of a flash memory device, the larger the value of the voltage at the floating gate. The increased voltage at the floating gate results in increased memory performance of the device.

FIG. 1 is a sectional view of a conventional ETOX flash memory device 2. ETOX device 2 includes a substrate 10, a source region 12, a tunnel oxide 14, a drain region 16, a floating gate 18, an inter-poly dielectric 20 and a control gate 22. The form of device 2 is a stack-gate structure, wherein floating gate 18 and control gate 22 have a self-aligned structure.

FIGS. 2(a) to 2(b) illustrate an example of process steps for the production of conventional ETOX flash memory device 2 as shown in FIG. 1.

FIG. 2(a) shows a first step in the process for making ETOX flash memory device 2. Following field oxidation, tunnel oxide 14 is formed on the surface of substrate 10. Floating gate 18, of polysilicon, is then deposited on tunnel oxide 14. Inter-poly dielectric layer 20 is then deposited on floating gate 18. Next, control gate 22, of polysilicon, is deposited on inter-poly dielectric layer 20.

FIG. 2(b) shows a subsequent step in the process for making ETOX flash memory device 2. A photoresist 24 is deposited on control gate 22 and patterned to conform to the region which will act as the gate structure of ETOX device 2. Etching is then conducted, leaving only those portions of control gate 22, inter-poly dielectric layer 20, floating gate 18 and tunnel oxide 14 which will act as the gate structure of ETOX device 2.

Photoresist 24 is then removed from control gate 22. Finally, source region 12 and drain region 16 are implanted in substrate 10 in the conventional manner. The resulting ETOX device is as shown in FIG. 1.

Conventional ETOX device 2 as shown in FIG. 1 allows the use of a minimum cell area. Further, inter-poly dielectric 20 can be formed to have a thickness approximately the same as tunnel oxide 14, resulting in a coupling efficiency as high as 50%.

In order to achieve a higher coupling efficiency, floating gate 18 can be overlapped by control gate 22. While a coupling efficiency higher than 60% can be achieved by such an overlap, the resulting ETOX device will have a larger cell area than the device of FIG. 1.

SUMMARY OF THE INVENTION

Accordingly, the present invention is directed to a new fabrication method of ETOX flash memory devices with increased coupling efficiency.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, there is provided a method of fabricating memory devices comprising steps of: forming a first dielectric layer on a substrate; etching a central region of the first dielectric layer to expose a portion of the substrate; forming a doped silicate-glass oxide layer on the first dielectric layer and the central region; forming a second dielectric layer on the doped silicate-glass oxide layer; performing an anisotropic etch on the second dielectric layer to form a sidewall spacer layer in the central region, wherein the sidewall spacer layer leaves a channel region of the doped silicate-glass oxide layer exposed; removing the exposed doped silicon-glass oxide layer from the channel region; forming a tunnel oxide on the channel region, wherein, during the tunnel oxide forming process, a dopant within the doped silicon-glass oxide diffuses into the substrate to form a sub-spacer source region and a sub-spacer drain region under the sidewall spacer layer; forming a floating gate over the first dielectric layer, the sidewall spacer layer and the tunnel oxide; forming an inter-poly dielectric on the floating gate; forming a control gate on the inter-poly dielectric; etching the control gate, the inter-poly dielectric and the floating gate, such that only a portion over the central region remains; removing the first dielectric layer; and implanting a source region and a drain region in the substrate, connected to the sub-spacer source region and the sub-spacer drain region, respectively.

Also in accordance with the present invention, there is provided an ETOX flash memory device comprising a substrate having a source and a drain region therein; a tunnel oxide on the substrate between the source and drain regions; a floating gate on the tunnel oxide, wherein the floating gate at its bottom has a width equal to the tunnel oxide, and at its top has a width greater than the tunnel oxide; a dielectric layer on the floating gate; and a control gate on the dielectric layer.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the invention and together with the description, serve to explain the principles of the invention.

DESCRIPTION OF THE PREFERRED EMBODIMENT

Reference will now be made in detail to a preferred embodiment of the invention, an example of which is illustrated in the accompanying drawings. Wherever possible, the same reference numbers will be used throughout the drawings to refer to the same or like parts.

FIGS. 3(a) to 3(f) illustrate a method for fabricating an ETOX flash memory device in accordance with the present invention.

As in the conventional method, the method of the present invention starts with the field oxidation of substrate 10 (not shown).

Figure 1:
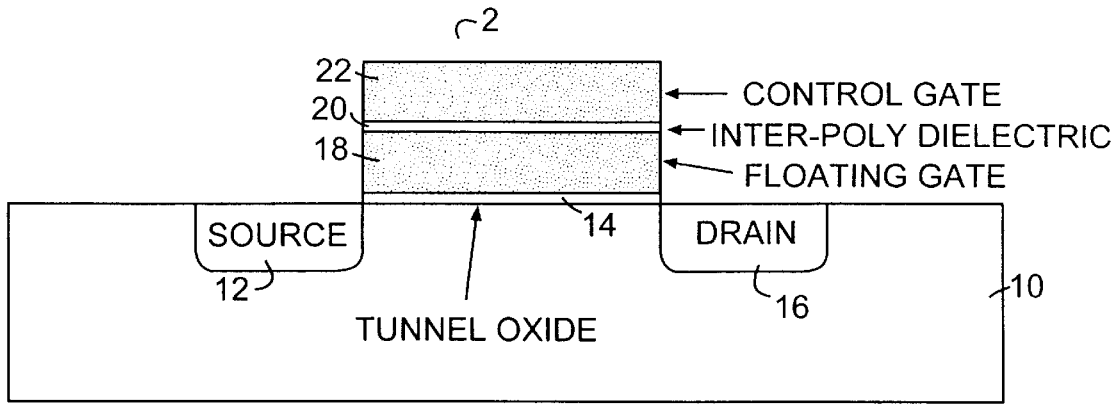
FIG. 1 is a section view of a conventional ETOX flash memory device.
Figure 2A:
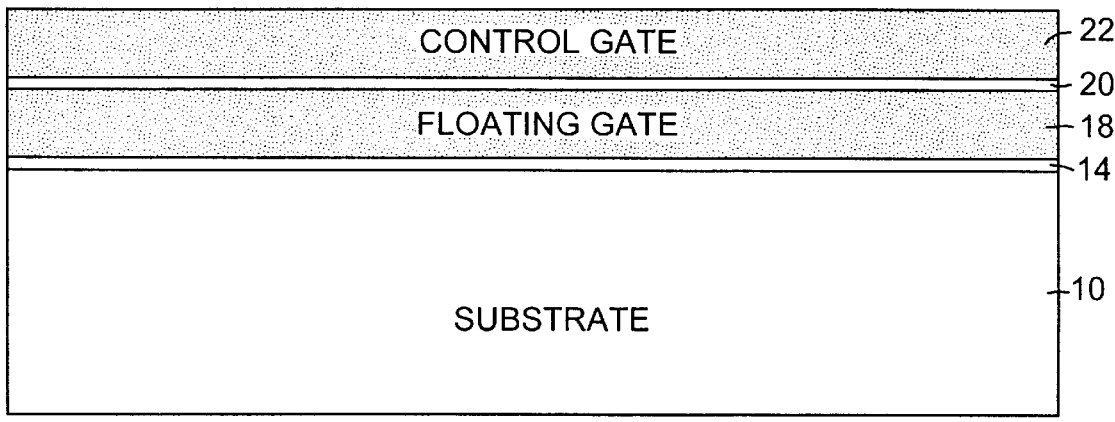
FIGS. 2(a) and 2(b) are sectional views illustrating a conventional method for fabricating an ETOX flash memory device.
Figure 2B:
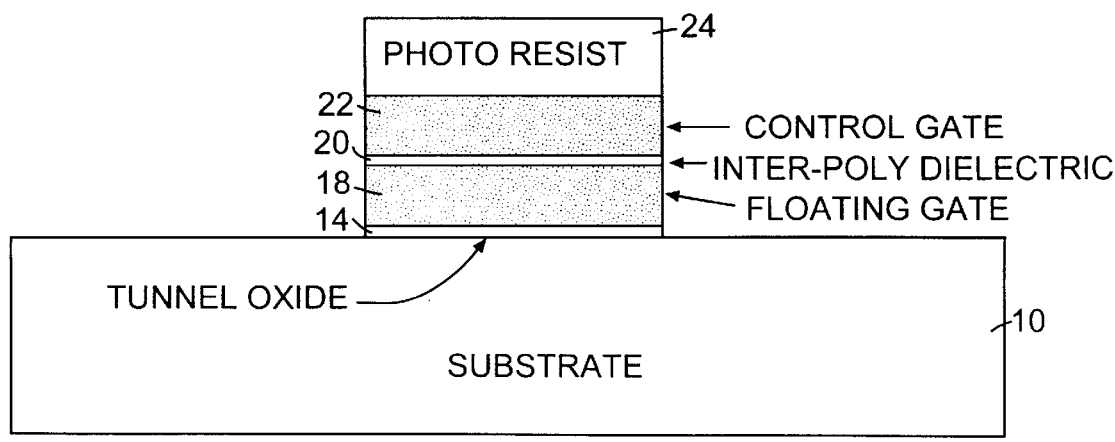
Figure 3A:
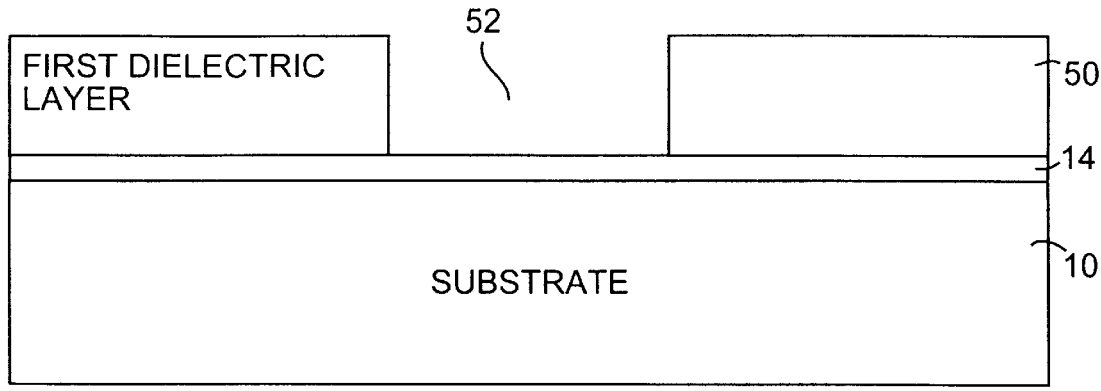
FIGS. 3(a) to 3(f) are sectional views respectively illustrating a method for fabricating an ETOX flash memory device in accordance with the present invention.

With reference to FIG. 3(a), a first dielectric layer 50 is formed on substrate 10. First dielectric layer 50 can be formed from oxide, polysilicon, or silicon nitride. The thickness of first dielectric layer 50 is preferably within the range from 10 nm to 1 μm. Next a photo mask region of photoresist is deposited on the surface of first dielectric region 50 except for a central region 52. Central region 52 is then etched, exposing substrate 10 within central region 52. The width of central region 52 can be from 0.01 μm to 5 μm.

Figure 3B:
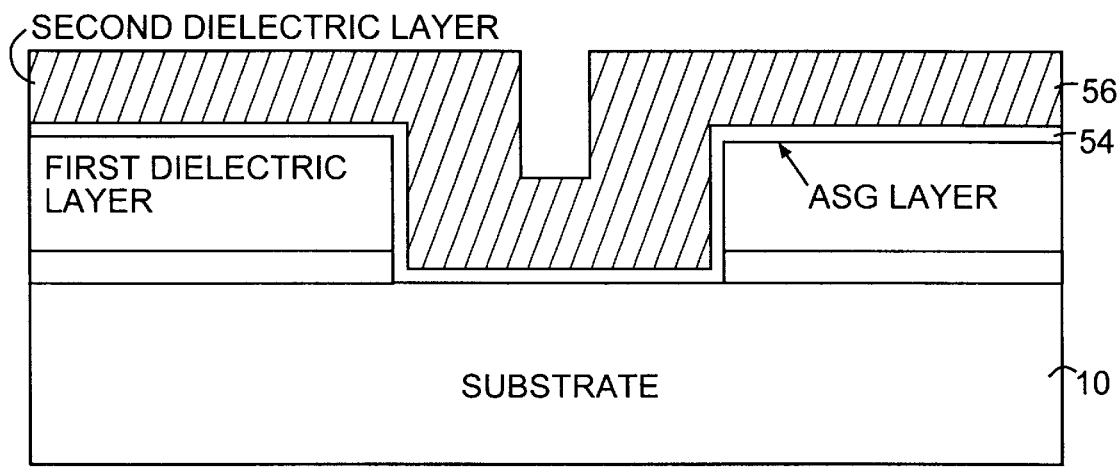

As shown in FIG. 3(b) following the etching of first dielectric layer 52, a silicate-glass oxide layer 54 is deposited over the remaining portions of first dielectric layer 50 and the exposed portion of substrate 10. Silicate-glass oxide layer 54 is doped with arsenic, phosphorus, or boron. In the preferred embodiment arsenic is used as the dopant resulting in a layer of arsenic silicate-glass (ASG) having a thickness in the range from 1 nm to 1 μm. Next, a second dielectric layer 56 is deposited on silicate-glass oxide layer 54. Second dielectric layer 56 can be formed from oxide or silicon nitride. Second dielectric layer 56 preferably has a thickness in the range from 10 nm to 1 μm.

Figure 3C:
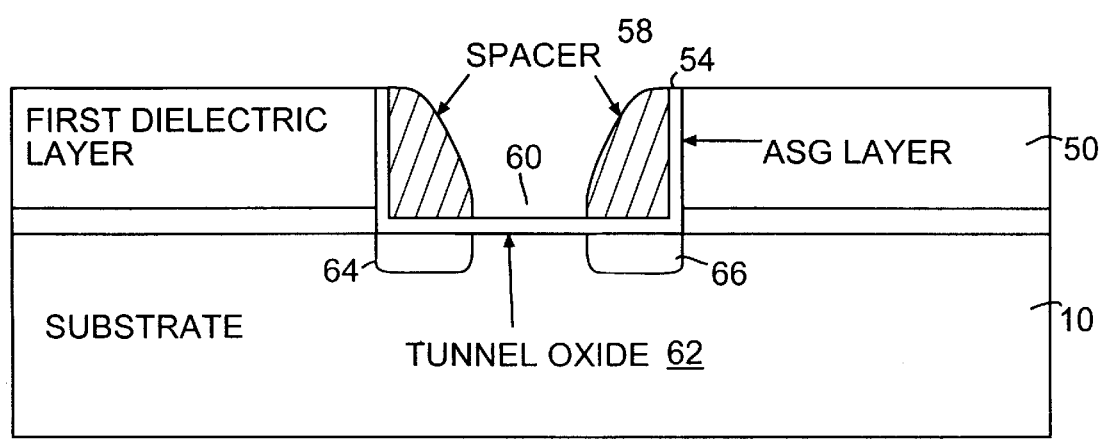

FIG. 3(c) shows a subsequent illustrative stage in the ETOX flash memory processing method. Second dielectric layer 56 is etched anisotropically, using known methods, to form sidewall spacer layers 58. A memory channel region 60, defined by this etching, has a width in the range from 0.01 μm to 5 μm, and is always smaller than the width of central region 52. Silicate-glass oxide layer 54 is then removed from memory channel region 60. This results in the exposure of substrate 10 in memory channel region 60. Next, a tunnel oxide 62 is grown on substrate 10 within memory channel 60. Known processes for the formation of tunnel oxide 62 include conventional furnace oxidation or rapid-thermal oxidation. During the formation of tunnel oxide 62, the dopant within silicate-glass oxide layer 54 is out diffused into the substrate, forming a sub-spacer source 64 and a sub-spacer drain 66 under the left and right sidewall spacer layers 58, respectively.

Figure 3D:
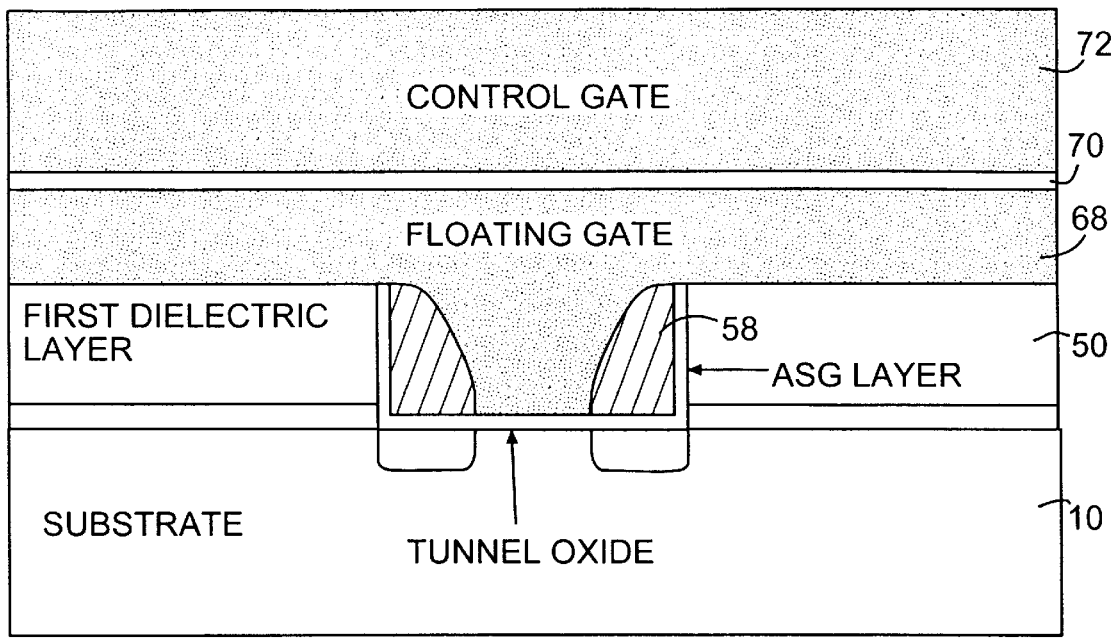

Next, as shown in FIG. 3(d), conductive material for forming a floating gate 68 is formed over the exposed surface of the structure. Floating gate 68 is preferably composed of polysilicon having a thickness in the range from 10 nm to 1 μm above the surface of first dielectric layer 50. Next, a dielectric material for forming an inter-poly dielectric 70 is formed on floating gate 68. Inter-poly dielectric 70 is preferably made from oxide, nitride oxide (NO) or reoxidized nitride oxide (ONO) film, having a thickness between 1 nm and 0.1 μm. Then a conductive material for forming a control gate 72 is deposited on top of inter-poly dielectric 70. Control gate 72 is preferably composed of polysilicon having a thickness in the range from 10 nm to 1 μm. The polysilicon is preferably doped with arsenic to a concentration in the range from $10^{19}$–$10^{21}$ $cm^{-3}$.

Figure 3E:
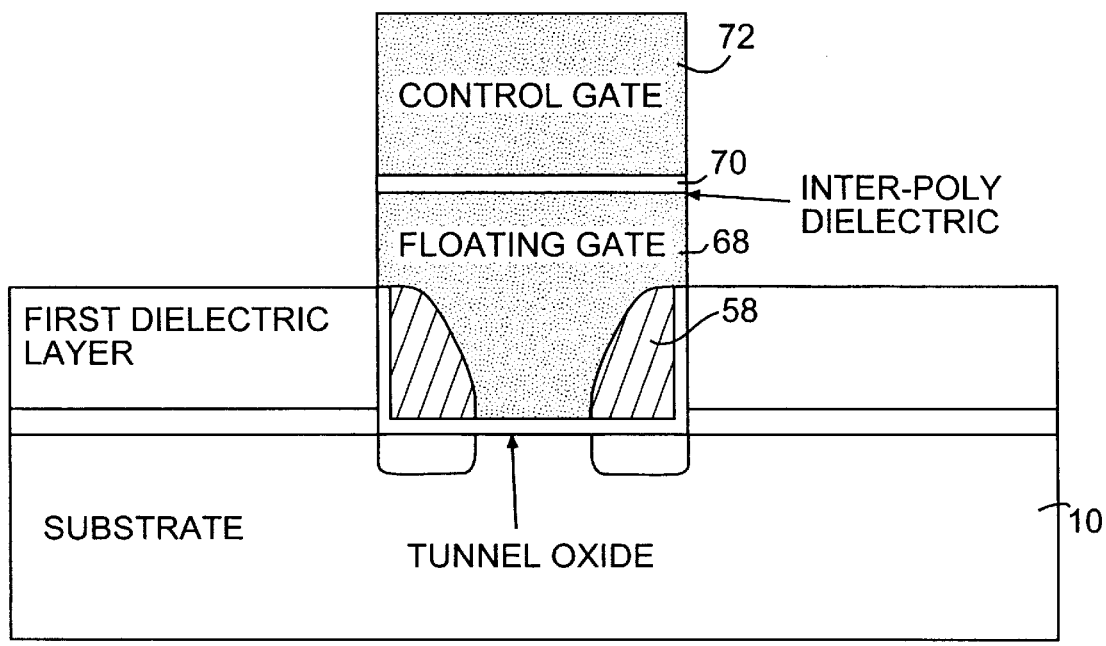

FIG. 3(e) shows a subsequent step in which a photomask region of photoresist (not shown) is deposited on the surface of control gate 72 corresponding to the width of central region 52. A self-aligned etch is then performed to form the structure including floating gate 68, inter-poly dielectric 70 and control gate 72 and to expose first dielectric layer 50.

Figure 3F:
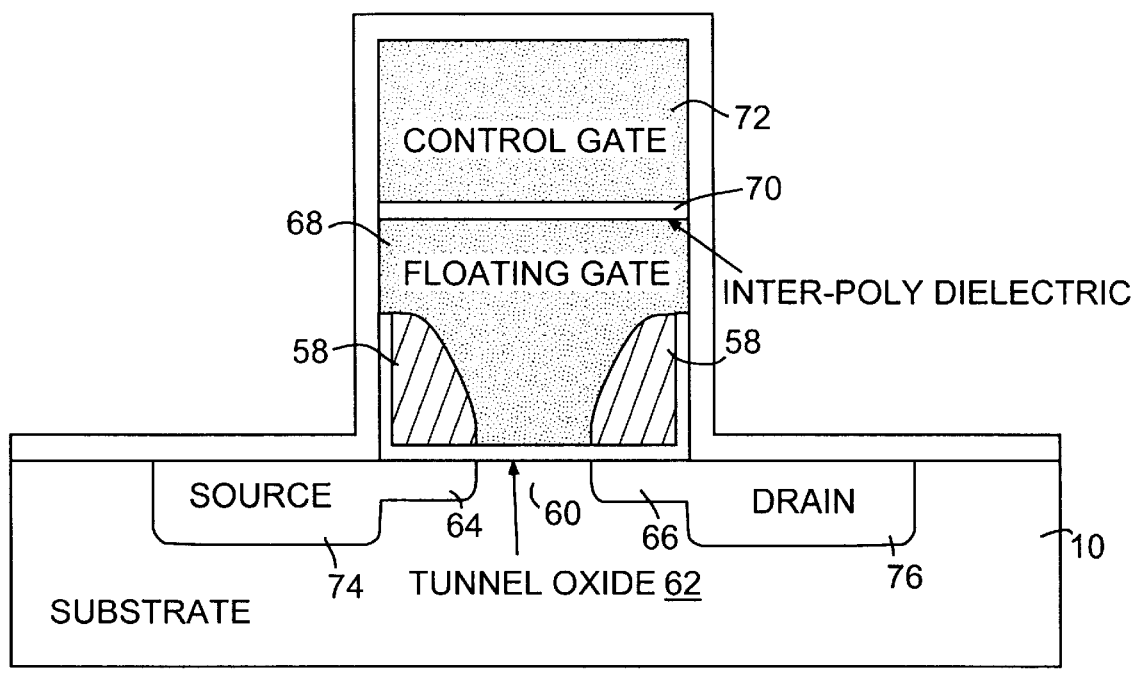

In the next step, shown in FIG. 3(f), first dielectric layer 50 is selectively removed. Then, an external source/drain implant is applied to form a source region 74 and a drain region 76. The newly implanted source region 74 and drain region 76 connect to sub-spacer source 64 and sub-spacer drain 66, respectively.

A capacitance between floating gate 68 and sub-spacer source/drain 64 and 66 due to the overlap of floating gate 68 with those regions has a magnitude inversely related to the thickness of spacers 58. In order to minimize this capacitance, and a potentially adverse effect it could have on coupling efficiency, thicker spacers 58 are used.

With reference to the exemplary embodiment of the invention, as shown in FIG. 3(f), a functional advantage results from its unique structure. Because the size of a capacitor consisting of control gate 72, inter-poly dielectric 70 and floating gate 68 is not limited by the size of tunnel oxide 62, the capacitor can be increased by a factor of at least 30%. The area of capacitive contact between control gate 72 and floating gate 68 is directly related to the coupling efficiency of the device. Therefore, the availability of a larger capacitor increases the coupling efficiency of the ETOX flash memory device.

Further, as opposed to conventional methods of increasing the coupling efficiency, the increased coupling efficiency achieved in accordance with the present invention is not linked to an increase in the size of the ETOX flash memory device. Specifically, the size of memory channel 60 is not linked to the size of the capacitor, so that the coupling efficiency can be increased without increasing the size of this active region. In fact, because the coupling efficiency is increased in the channel length direction, the overlapped area in the field region can be reduced to further reduce the cell size in the channel width direction.

It will be apparent to those skilled in the art that various modifications and variations can be made in the method of the present invention and in construction of this ETOX flash memory device without departing from the scope or spirit of the invention. It is intended that the specification and example be considered as exemplary only, with a true scope and spirit of the invention being indicated by the following claims.

What is claimed is:

1. A method for fabricating a memory device comprising:

forming a first dielectric layer on a substrate;

etching a central region of said first dielectric layer to expose a portion of said substrate;

forming a doped silicate-glass oxide layer on said first dielectric layer and said central region;

forming a second dielectric layer on said doped silicate-glass oxide layer;

performing an anisotropic etch on said second dielectric layer to form a sidewall spacer layer in said central region, wherein said sidewall spacer layer leaves a channel region of said doped silicate-glass oxide layer exposed;

removing said exposed doped silicon-glass oxide layer from said channel region;

forming a tunnel oxide on said channel region, wherein, during said tunnel oxide forming process, a dopant within said doped silicon-glass oxide diffuses into said substrate to form a sub-spacer source region and a sub-spacer drain region under said sidewall spacer layer;

forming a floating gate over said first dielectric layer, said sidewall spacer layer and said tunnel oxide;

forming an inter-poly dielectric on said floating gate;

forming a control gate on said inter-poly dielectric;

etching said control gate, said inter-poly dielectric and said floating gate, such that only a portion over said central region remains;

removing said first dielectric layer; and implanting a source region and a drain region in said substrate, connected to said sub-spacer source region and said sub-spacer drain region, respectively.

2. A method for fabricating a memory device as in claim 1, wherein said step of forming a first dielectric layer includes forming said first dielectric layer from one of oxide, polysilicon and silicon nitride.

3. A method for fabricating a memory device as in claim 1, wherein said first dielectric layer, said second dielectric layer, said control gate, and the portion of said floating gate on top of said first dielectric layer are each formed to have a thickness in the range from 10 nm to 1 $\mu$m.

4. A method for fabricating a memory device as in claim 1, wherein said step of forming a doped silicate-glass oxide layer includes forming said doped silicate-glass oxide layer doped with one of arsenic, phosphorous and boron.

5. A method for fabricating a memory device as in claim 1, wherein said doped silicate-glass oxide is arsenic silicate-glass.

6. A method for fabricating a memory device as in claim 1, wherein said step of forming said second dielectric layer includes forming said second dielectric layer from one of oxide and silicon nitride.

7. A method for fabricating a memory device as in claim 1, wherein said anisotropic etch is performed so as to remove more material from the center of said central region than from sides of said central region.

8. A method for fabricating a memory device as in claim 1, wherein said anisotropic etch is performed to define said channel region to have a width within the range from 0.01 $\mu$m to 5 $\mu$m.

9. A method for fabricating a memory device as in claim 1, wherein said step of forming a tunnel oxide includes forming said tunnel oxide by one of furnace oxidation and rapid-thermal oxidation.

10. A method for fabricating a memory device as in claim 1, wherein said steps of forming a floating gate and forming a control gate include forming said floating gate and said control gate of polysilicon.

11. A method for fabricating a memory device as in claim 1, wherein said step of forming an inter-poly dielectric includes forming said inter-poly dielectric from one of oxide, nitride oxide and reoxidized nitride oxide film.

12. A method for fabricating a memory device comprising:

forming a first dielectric layer on a substrate;

forming a trench in the dielectric layer;

forming a doped silicate-glass layer in the trench;

forming a tunnel oxide in the trench, wherein during the formation of the tunnel oxide a dopant of the doped silicate-glass layer diffuses into the substrate to form a portion of a source region and a portion of a drain region;

forming a floating gate layer on the tunnel oxide;

forming a second dielectric layer on the floating gate layer;

forming a control gate layer on the dielectric layer; and patterning the floating gate layer, dielectric layer and control gate layer to form a floating gate and a control gate.

13. An ETOX flash memory device comprising:

a substrate have a source region and a drain region therein;

a tunnel oxide on said substrate between said source and said drain regions;

a floating gate on said tunnel oxide, wherein a lower portion of said floating gate is formed having curved sides such that the floating gate at its bottom has a width equal to said tunnel oxide, and at its top has a width greater than said tunnel oxide;

sidewall spacers formed around the lower portion of said floating gate;

doped silicate-glass oxide layers formed on a bottom and a side surface of the sidewall spacers;

a sub-spacer source region coupled to the source region;

a sub-spacer drain region coupled to the drain region;

a dielectric layer on said floating gate; and a control gate on said dielectric layer.

14. A method for fabricating a memory device as in claim 12, wherein said step of forming a first dielectric layer on the substrate includes forming said first dielectric layer from one of oxide, polysilicon and silicon nitride.

15. A method for fabricating a memory device as in claim 12, wherein said first dielectric layer, said second dielectric layer, said control gate, and a portion of said floating gate extending above said first dielectric layer are each formed to have a thickness in the range from 10 nm to 1 $\mu$m.

16. A method for fabricating a memory device as in claim 12, wherein said step of forming a doped silicate-glass oxide layer includes forming said doped silicate-glass oxide layer doped with one of arsenic, phosphorous and boron.

17. A method for fabricating a memory device as in claim 12, wherein said doped silicate-glass oxide is arsenic silicate-glass.

18. A method for fabricating a memory device as in claim 12, wherein said step of forming said second dielectric layer includes forming said second dielectric layer from one of oxide and silicon nitride.

19. A method for fabricating a memory device as in claim 12, wherein the tunnel oxide defines a channel region, and wherein the gate oxide has a width within the range from 0.01 $\mu$m to 5 $\mu$m.

20. A method for fabricating a memory device as in claim 12, wherein said step of forming a tunnel oxide includes forming said tunnel oxide by one of furnace oxidation and rapid-thermal oxidation.

21. A method for fabricating a memory device as in claim 12, wherein said steps of forming a floating gate and forming a control gate include forming said floating gate and said control gate of polysilicon.

22. A method for fabricating a memory device as in claim 12, wherein said step of forming the second dielectric includes forming said second dielectric from one of oxide, nitride oxide and reoxidized nitride oxide film.

23. A memory device according to claim 13, wherein the dielectric layer is comprised of one of oxide, polysilicon and silicon nitride.

24. A memory device according to claim 13, wherein said second dielectric layer, said control gate, and a portion of said floating gate extending above sidewall spacers are each formed to have a thickness in the range from 10 nm to 1 $\mu$m.

25. A memory device according to claim 13, wherein said doped silicate-glass oxide layer is doped with one of arsenic, phosphorous and boron.

26. A memory device according to claim 13, wherein said doped silicate-glass oxide is arsenic silicate-glass.

27. A memory device according to claim 13, wherein said dielectric layer is formed of one of an oxide and silicon nitride.

28. A memory device according to claim 13, wherein said tunnel oxide defines a channel region having a width within the range from 0.01 µm to 5 µm.

29. A memory device according to claim 13, wherein said floating gate and said control gate are formed of polysilicon.

30. A memory device according to claim 13, wherein said dielectric on said floating gate is formed from one of an oxide, a nitride oxide and a reoxidized nitride oxide film.

* * * * *

UNITED STATES PATENT AND TRADEMARK OFFICE
CERTIFICATE OF CORRECTION

PATENT NO.: 6,153,904

DATED: November 28, 2000

INVENTOR(S): Yang

It is certified that an error appears in the above-identified patent and that said Letters Patent is hereby corrected as shown below:

Claim 13, column 6, line 5, change "substrate have" to --substrate having--.

Signed and Sealed this

Twenty-second Day of May, 2001

*Attest:*

NICHOLAS P. GODICI

*Attesting Officer*     *Acting Director of the United States Patent and Trademark Office*